United States Patent [19]

Ludikhuize et al.

[11] Patent Number: 4,908,551
[45] Date of Patent: Mar. 13, 1990

[54] DC/AC BRIDGE CIRCUIT

[75] Inventors: Adrianus W. Ludikhuize; Job F. P. van Mil; Franciscus A. C. M. Schoofs, all of Eindhoven, Netherlands

[73] Assignee: U.S. Philips Corporation, New York, N.Y.

[21] Appl. No.: 267,059

[22] Filed: Nov. 4, 1988

[30] Foreign Application Priority Data

Nov. 27, 1987 [NL] Netherlands .......................... 8702847

[51] Int. Cl.[4] ............................................ H05B 37/02
[52] U.S. Cl. ................................ 315/209 R; 315/224
[58] Field of Search .................. 315/209 R, 224, 225, 315/240, DIG. 5, DIG. 7

[56] References Cited

PUBLICATIONS

A. W. Ludikhuize, "A Versatile 250/300-VIC Process for Analog and Switching Applications", IEEE Transactions on Electronic Devices, vol. ED-33, No. 12, Dec. 1986, pp. 2008-2015.

*Primary Examiner*—Eugene R. LaRoche
*Assistant Examiner*—Robert J. Pascal
*Attorney, Agent, or Firm*—Bernard Franzblau

[57] ABSTRACT

In full or half DC/AC bridge circuits, the current through the control circuit, by which the power transistors T1,T2 are switched, is derived from the high supply voltage via a resistor. In order to reduce this current and the dissipation associated therewith, the control circuit includes an additional switch, preferably a MOST T4, which is non-conducting when the inverter transistor T3 is conducting and which is conducting when the transistor T3 is non-conducting. The control circuit thus becomes practically currentless. When the control electrode is applied to a suitable voltage, the transistor T4 can be controlled by its source voltage and thus becomes self-controlling. Thus, the circuit can be kept simple. The bridge circuit is particularly suitable for use with gas discharge lamps.

13 Claims, 2 Drawing Sheets

DC/AC BRIDGE CIRCUIT

BACKGROUND OF THE INVENTION

This invention relates to a DC/AC converter, more particularly a bridge circuit for gas discharge lamps comprising an integrated circuit having connection terminals for the application of a high direct voltage and a low direct voltage, a first insulated gate field effect transistor, whose drain is connected to a first connection terminal, and a second insulated gate field effect transitor, whose source is connected to the second connection terminal, the source of the first field effect transistor and the drain of the second field effect transistor both being connected to an output terminal. A control circuit is provided by means of which an alternating control signal can be supplied to the gate of the second field effect transistor and in inverted form to the gate of the first field effect transistor, as a result of which the first and second field effect transistors in push-pull can be made conducting and non-conducting. This control circuit comprises an inverter stage having a third insulated gate field effect transistor, whose source is connected to the second connection terminal, whose gate is connected to the gate of the second field effect transistor and whose drain is connected to a load element and to the gate of the first field effect transistor.

Such a converter is known inter alia from the article "A Versatile 250/300-V IC Process for Analogue and Switching Applications" by A. W. Ludikhuize, published in I.E.E.E. Transactions on Electron Devices, Vol. ED-33, No. 12, December 1986, pp. 2008/2015.

As is known, the stability and the efficiency of gas discharge lamps marketed, for example, under the designations SL and PL can be considerably improved when they are operated with an alternating voltage whose frequency is considerably higher than that of the mains voltage, for example, a frequency between 1 and 100 kHz. The bridge circuit serves to convert a direct voltage, which can be obtained by means of a rectifier circuit from the supply mains, into this high-frequency alternating voltage. In principle, this bridge circuit is composed of two switches, which are connected in series between a high and a low supply voltage and are operated in push-pull and connect the output terminal alternately to the high and the low supply voltage. In the case in which only such a branch of switches is present between the positive and the negative supply, the other side of the discharge lamp is kept at a DC level halfway between the positive and the negative supply. This embodiment, the so-called half bridge circuit, is simplest and ensures that half of the supply voltage is available for the lamp. The other embodiment, as shown, for example, in FIG. 14 of the aforementioned publication comprises two branches of switches, the lower switch of one branch being switched on and off simultaneously with the upper switch of the other branch. This so-called full bridge, whose construction and operation are more complicated than the half bridge, ensures that the whole supply voltage is available for the lamp. It will be clear without further explanation from the following description that the invention can be used both in full bridge circuits and in half bridge circuits.

In the full bridge circuit described in the aforementioned publication, the switches are constituted by n-type channel MOS transistors of practically identical construction. The source of one transistor (T2/T4) and the drain of the other transistor (T1/T3) are connected to the negative (O V) and the positive supply, respectively. The other source and drain zones are both connected to the output terminal (1/02). The inverter transistor (T5/T6) is also constituted by an n-channel MOS transistor, whose source is connected to the negative supply (O V). When a positive voltage is applied to the gate or control electrode of the inverter transistor, this transistor becomes conducting and the control electrode of the said other transistor (T1/T3) is connected to the low supply (ground). This transistor is then non-conducting (closed). The positive control signal is then applied to the control electrode of the said one transistor (T2/T4), which is then in the conductive state. The output terminal is then at the low level. In the other situation, in which a low control signal is supplied to the control electrode of the inverter transistor and to the one transistor (T2/T4) so that these transistors are non-conducting, the control signal should not only be inverted, but also the voltage level has to be shifted in order to guarantee that the voltage between the control electrode and the source of the transistor (T1/T3) remains higher than the threshold voltage. This shift in level is obtained by means of a so-called bootstrap circuit between the output terminal (01/02) and the control electrode of the transistor (T1/T3) and by means of the rectifier diodes, as a result of which a control voltage can be obtained which lies almost 15 V above the supply voltage.

The bootstrap circuit comprises a 15 V auxiliary voltage, a diode, a capacitor and a resistor. This resistor of, for example, 5 k Ω has a double function. In the first place, it permits the application of a voltage across the bootstrap capacitor when the inverter transistor is conducting and hence a current flows through the inverter circuit. A second effect of this resistor is that together with the parasitic capacitance of the control electrode of T1/T3 an RC time is formed which, when T1/T3 is switched on, causes a delay, so that in each branch both switches can not simultaneously conduct. For the last-mentioned reason, the control electrode of T2/T4 is also connected to a resistor and a diode is connected across this resistor so that the process of switching off T2/T4 is effected rapidly.

Experiments with the bridge circuit described here have shown that the current consumption and the dissipation in the inverter circuit are fairly high when, for the sake of simplicity, the 15 V auxiliary voltage is derived via a resistor from the high direct voltage, as a result of which the temperature of the circuit can rise to an undesired high level. Because of the high cost involved, it is generally not possible to reduce the temperature by a better cooling system. A reduction of the dissipation by means of a higher load resistor—in the said bridge circuit 5k Ω— is hardly possible because of the higher RC times introduced thereby, as a result of which the transistor connected to the positive supply would be switched on again too late.

SUMMARY OF THE INVENTION

An object of the invention is to provide a full or half bridge circuit of the kind mentioned in the opening paragraph having a lower dissipation than the known circuit while maintaining the favorable porperties of the known circuit.

A DC/AC converter according to the invention is characterized in that the current path of the inverter stage includes, between the load element and the third field effect transistor, a switch in the form of a fourth transistor, which is of a type complementary to that of the first, second and third field effect transistors and has a control electrode which is connected to a point of the circuit such that during operation, a voltage is applied to the control electrode such that in the state in which the second and third field effect transistors are conducting, the fourth field effect transistor is non-conducting or at least substantially non-conducting, and in that in the other state in which the second and third field effect transistors are non-conducting, the fourth transistor is conducting.

The invention is based on the recognition of the fact that for switching a transistor the voltage between the control electrode (gate) and the source electrode is essential and that with a constant control voltage the transistor can be switched on and off by varying the potential of the source electrode (emitter). In this mode of operation, the source (emitter) elecode of the transistor functions as the control electrode. For a switch in the form of a transistor of the complementary type, the voltage variations at the source electrode are such that this transistor becomes conducting and non-conducting at the desired instants without it being necessary for an additional control signal to be applied. Due to the fact that now in the current path of the inverter stage either the third field effect transistor or the fourth transistor is non-conducting, the dissipation during operation is considerably limited.

BRIEF DESCRIPTION OF THE DRAWINGS

The invention will be described more fully with reference to a few embodiments and the accompanying diagrammatic drawing, in which.

DESCRIPTION OF THE PREFERRED EMBODIMENT

Figure 1:
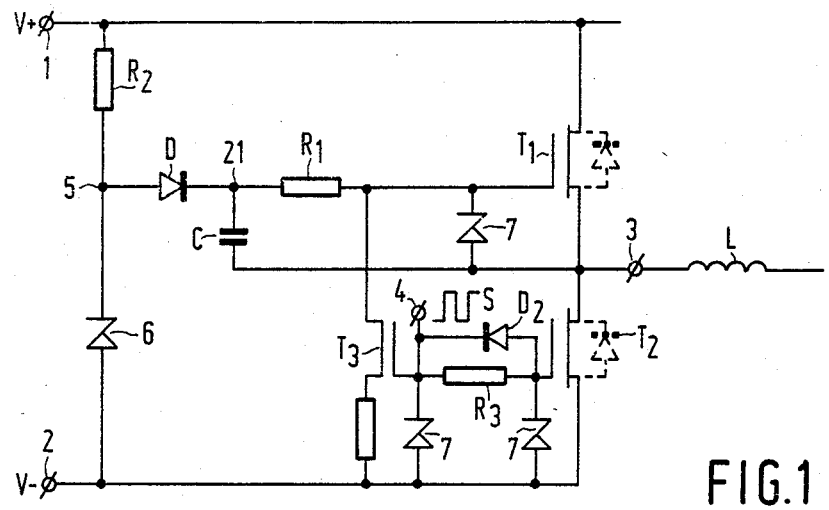
FIG. 1 shows the circuit diagram of a known half bridge circuit.

FIG. 1 shows a bridge circuit as described in the aforementioned article "A Versitile 250/300-V IC Process for Analogue and Switching Applications" by A. W. Ludikhuize, published in I.E.E.E. Transactions on Electron Devices, Vol. ED-33, No. 12, December 1986, pp. 2008/2015. FIG. 1 only shows a half bridge, but it will be appreciated without further explanation that the circuit shown in FIG. 1 can readily be extended to a full bridge by doubling, as shown in FIG. 14 of the said publication.

The circuit can be accommodated at least for the major part in an integrated circuit and has two connection terminals 1 and 2 for the application of a high and a low direct voltage, respectively, designated in the drawing by V+ and V−. The voltage V− is, for example, ground potential; V+ lies, for example, between 100 and 400 V. This direct voltage can be generated from the supply mains in known manner by a rectifier circuit not shown in the drawing.

The circuit comprises two field effect transistors T1 and T2, which are connected in series between the terminals 1 and 2, the junction point being connected to an output terminal 3. In the present embodiment, in which the transistors T1 and T2 are, by way of example, of the n-channel type, the drain of T1 is connected to the terminal 1 and the source of T2 is connected to the terminal 2, while the source of T1 and the drain of T2 are connected to the output terminal 3.

During operation, the transistors T1 and T2 are made conducting and non-conducting in push-pull, as a result of which the terminal 3 is alternately connected to V+ and V−. For this purpose, a control circuit is present, which comprises means 4 for applying a control signal S to the gate electrode of T2. In the embodiment shown here, a connection terminal 4 supplies an externally generated control signal S. However, it will be appreciated that the signal S may also be generated in another part of the integrated circuit itself. The control circuit moreover comprises an inverter stage having as inverter transistor the field effect transistor T3 and as a load element the resistor R1. The signal S thus can be supplied, after integration, to the gate electrode of T1.

In the embodiment described here comprising identical transistors T1 and T2, the control circuit is moreover provided with a voltage level shifter, by means of which a sufficiently high voltage above the threshold voltage can be applied to the gate electrode of T1. The voltage shifter comprises a capacitor C, one plate of which is connected to the output 3 and the other plate of which is connected via the rectifier D to the junction point 5. By means of the resistor R2 and the Zener diode 6, which are connected in series between the terminals 1 and 2, a constant potential of, for example, 15 V can be applied to the junction point 5.

The circuit further comprises three Zener diodes 7 as voltage limiters which, however, are not essential to the invention and which will therefore not be described further. Between the terminal 4 and the gate electrode of T2 are arranged a resistor R3 and a diode D2, whose function will be explained more fully hereinafter. The inductive load with a gas discharge lamp is indicated diagrammatically by the inductance L.

Figure 2:
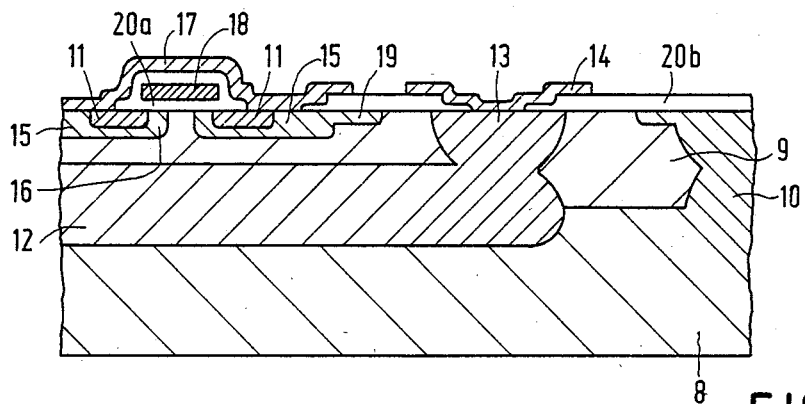
FIG. 2 shows in sectional view a high-voltage transistor for use in the bridge circuit shown in FIG. 1.

FIG. 2 is a sectional view of (a part of) the transistor T1 or T2. The device is obtained in a D-MOS (Double diffused MOS) process with a p-type Si substrate 8 and an n-type epitaxial layer 9 grown on it. The transistor T1/T2 is provided in an island in the epitaxial layer laterally bounded by the deep p-type island insulation 10. The transistors T1/T2 are vertical D-MOST's having a source region 11 constituted by n-type surface zones 11 and a drain zone in the form of an n-type buried layer 12, which is located at the interface between the epitaxial layer 9 and the substrate 8 and which is connected at the side of the transistor via the deep n-contact zone 13 to the drain electrode 14. The n-type source zones 11 are provided (diffused) in p-type surface zones 15, which are diffused at least in part through the same mask as the zones 11, but to a greater depth than the zones 11, into the epitaxial layer 9. The narrow regions 16 in the zones 15 located between the source zones 11 and the epitaxial layer 9 constitute the channel regions of the transistor. The n-zones 11 and the p-type zones 15 are shortcircuited by the source electrode 17. The gate electrode 18 is provided over the channel regions 16 and extends to above the drift region between the zones 15, in which the electrons drift in vertical direction to the buried zone 12. Moreover, the p-type zones 15 are provided on the side remote from the channel region 16 with a weakly doped p-type zone 19, which, as described in the said publication, serves to increase the breakdown voltage. Such a zone is also provided at the island insulation 10. The surface of the semiconductor body is coated with an oxide layer 20, which is thin (20a) above the channel regions 16 (a thickness of, for example, about 0.1 $\mu$m) and is thick (20b) above surrounding parts (a thickness of, for example, about 0.8 and 3 $\mu$m). The device can be manufactured in known manner, in which the zones 11,15 are provided in a selfregistered manner with respect to the gate 18 generally of polycrystalline silicon. The contacts 14,17 can be made of a suitable metal, for example A1.

It should be noted that the pn junctions between the p-type zones 15 and the n-type epitaxial layer 9 constitute parasitic diodes, which during operation can be foreward-biased. In FIG. 1, these diodes are indicated by broken lines.

The transistor T3 may also be constituted by a similar DMOST, but may alternatively be constituted, as described in the said publication, by a lateral DMOST. Such a DMOST is mainly distinguished from the configuration shown in FIG. 2 in that the drain is located beside the channel region, as a result of which the current mainly flows in a lateral direction.

The circuit in principle operates as follows: When the signal S is high, the transistors T2 and T3 are conducting and the transistor T1 is non-conducting. A current then flows via the inductive load L and via T2 to V−. The junction point 3 or output terminal 3 is low, as a result of which the capacitance C is charged via the diode D to practically 15 V. When the control signal S becomes low, T2 and T3 become non-conducting (via diode D2). The inductance L then causes the voltage at the output 3 to increase very rapidly, as a result of which the parasitic diode of T1 can be temporarily forward-biased. At the same time, the voltage at the junction point 21 increases and due to the rectifier D can reach a value higher than V+, i.e. about V++15 V. This high voltage is passed on via R1 to the gate electrode of T1. Before the current in L reverses its direction, T1 must be conducting via R1 and the input capacitance of the gate of T1 so that R1 must not have too high a value. On the other hand, the value of R1 must not be too low because this resistor ensures, like R3, that T1 and T2 are not simultaneously conducting. When T1 is conducting, the current through the load L increases in the reverse direction. When now T1 is switched off and T2 is switched on by means of the control signal S, the potential at the output 3 decreases due to the inductive load, as a result of which the internal diode of T2 becomes conducting. T2 is then rendered conducting delayed by the RC time of the gate electrode of T2, as a result of which the current through L again reverses its direction.

In practical embodiments of the circuit described here, it has been found that the dissipation is comparatively high. The invention is based inter alia on the recognition of the fact that this high dissipation is due to the current flowing in R2 and the inverter stage D, R1, T3 when T3 is conducting.

Figure 3:
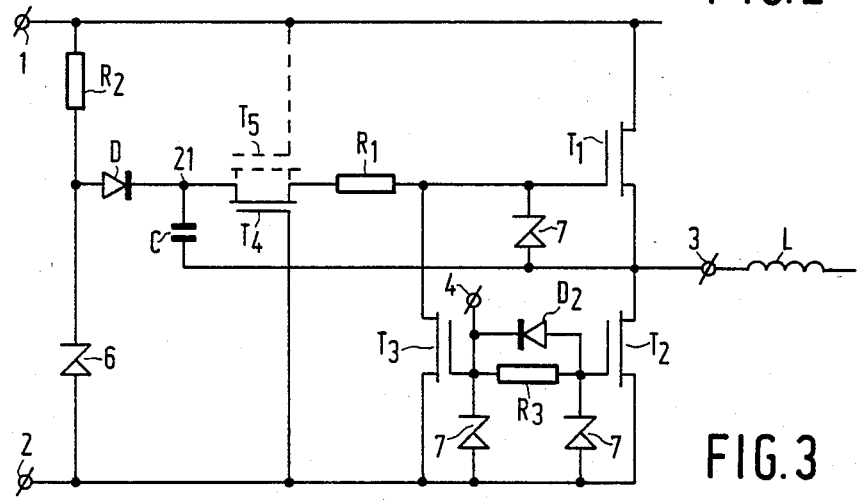
FIG. 3 shows the circuit diagram of the half bridge circuit according to the invention.

FIG. 3 shows the same circuit diagram as FIG. 1, but now provided with means for reducing the dissipation in the inverter stage R1, T3. These means mainly comprise a fourth transistor T4 or T5, whose source and drain electrodes are connected in the current path of the inverter stage D, R1, T3 and whose gate electrode (base) is connected to a point of the circuit which has a fixed potential during operation. The transistor T4 or T5 is of a type complementary to T3, therefore in the present embodiment of the p-type.

It should be noted that in FIG. 3 two different versions are shown, one with T4 indicated in full lines and the other with T5 indicated in broken lines. The embodiment with T4 can be employed with the use of a field effect transistor of the enhancement type and the embodiment with T5 can be employed with the use of a field effect transistor of the depletion type.

Figure 4:
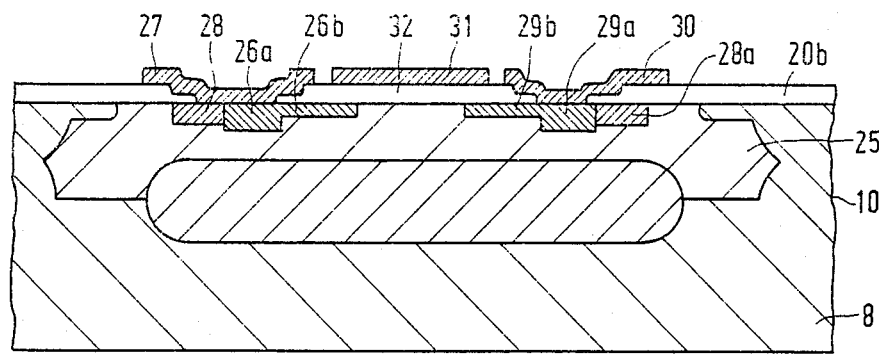
FIG. 4 shows in sectional view a first embodiment of the switch T4 in FIG. 3.

In the first case, in which the transistor T4 is used, the gate electrode is connected to the low voltage and therefore to the terminal 2. A possible embodiment of the transistor, whose manufacture must be realizable in the technology shown with reference to FIG. 2, is shown in FIG. 4. The transistor is provided in an island 25 of the epitaxial layer again laterally insulated by deep p-type zones 10. The source and drain zones are provided with reduced doping gradients (graded) in connection with the high operating voltage. The source zone comprises a highly doped p-surface zone 26a, which can be formed simultaneously with the zones 15 of the transistors T1/T2, and a high-ohmic extension 26b, which can be formed simultaneously with the high-ohmic zone 19 (FIG. 2). The source contact electrode 27 is connected not only to the source 26, but also to the island 25 via the n-type contact zone 28 and to the junction point 21 in the circuit shown in FIG. 3. The drain zone is practically identical to the source and comprises a highly doped zone 29a and a weakly doped extension 29b and a drain contact 30 connected to the resistor R1. Outside the drain zone, a channel stopper 28A is provided having the form of an n+ surface zone. The gate electrode 31 of, for example, Al is provided on a gate oxide 32, which can be manufactured simultaneously with the field oxide 20b and has a thickness of, for example, 3 $\mu$m. In specific embodiments, the threshold voltage of T4 lies between 30 and 50 V.

If during operation T3(and therefore also T2) becomes conducting, the potentials of the output 3, of the gate electrode of T1 and of both sides of the resistor R1 fall to a low value. The voltage between the source of T4 and its gate electrode is then at most about 15 V, which with a threshold voltage of 50 V is too low to render the transistor T4 conducting. The transistor T4 is therefore non-conducting in these ocnditions. The inverter stage D, R1, T3 now becomes currentless or at least substantially currentless, as a result of which the dissipation is very strongly reduced as compared with the circuit shown in FIG. 1. If T3 and T2 are switched off, as described with reference to FIG. 1, the potential at the output terminal 3 increases very rapidly. Via the capacitance C, the potential at the source of T4 increases to the value V++15 V and therefore to a value which is considerably higher than the threshold voltage of T4. The transistor T4 becomes conducting, as a result of which the said high voltage is passed on, delayed by R1, to the gate electrode of T1.

Figure 5:
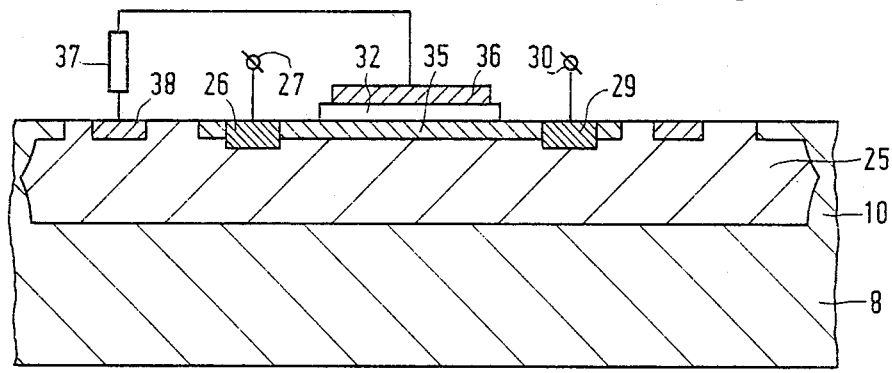
FIG. 5 shows in sectional view a second embodiment of the switch T3 in FIG. 3.

FIG. 5 shows diagrammatically in sectional view an embodiment of the transistor T5. This transistor is more particularly distinguished from T4 in that a p-type implantation is carried out in the channel region of the transistor, as a result of which conduction already occurs in the transistor at a gate-source voltage of 0 V.

For this implantation again the implantation step required for the zones 19 in FIG. 2 can be used. The gate electrode 36, which, as in FIG. 4, is provided on 3 μm thick gate oxide 32, is connected to the terminal 1, to which the high voltage is applied. In order to increase the threshold voltage to a favourable value, the island 25 is connected not to the drain 26, but, if desired, via a resistor 37 and an n-type contact zone 38 to the gate electrode 36, as a result of which during operation the potential of the island 25 is increased and this island acts as a second gate electrode (back gate) of the transistor.

The operation of the circuit with T5 is practically identical to the operation described above with T4. When T3 and T2 are conducting, the potential at the source and drain zones of T5 is so low that the channel in T5 is fully pinched off, as a result of which no current can flow in the path D, T5, R1, T3. When T2 and T3 are switched off, the potential at the output terminal 3 again increases rapidly, as a result of which the source zone 26 of T5 can increase to $V+ +15$ V. The p-channel of the transistor T5 again becomes conducting, as a result of which the high voltage $V+ +15$ V can be passed on to the gate electrode of T1. Since the potential of the source 26 of T5 is raised to above $V+$, i.e. the potential of the n-type island 25, the pn junction between the zone 26 and the island 25 can become forward-biased. In order to limit this current, the resistor 37 in the current path of the island 25 at $V+$ is desired. If desired, this resistor may be included in the same island as T5. If desired, the potential may be passed on to the zone 25 via a diode; the region 38 then should be of the p-type. The distance from regions 26–30 must be great and, as the case may be, a buried n+ layer may be provided in order to keep the parasitic pnp effect low.

Figure 6:
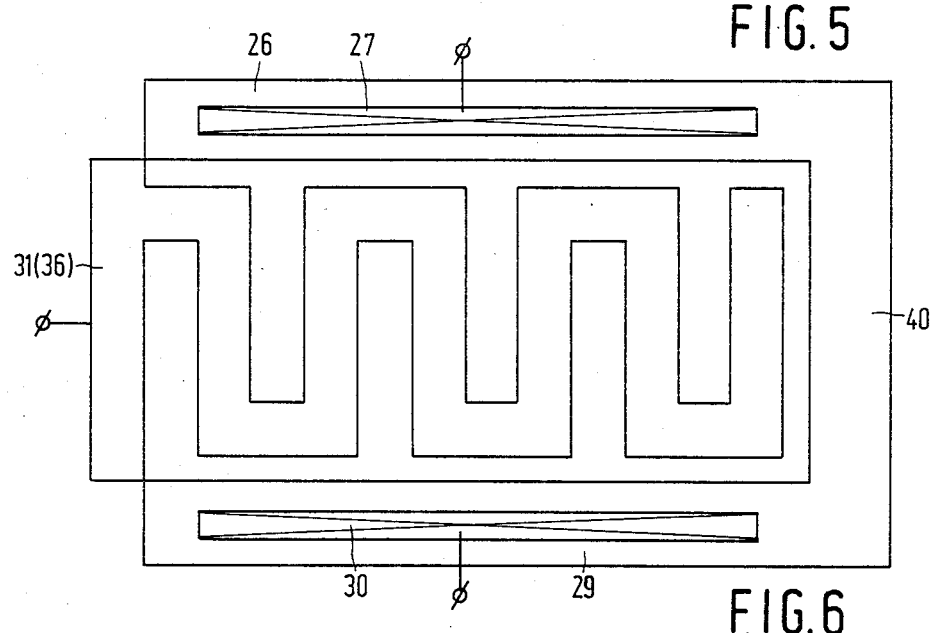
FIG. 6 is a plan view of a further embodiment of the transistor T4 or T5 in FIG. 3.

FIG. 6 is a plan view of a further embodiment of the fourth field effect transistor limiting the current. The transistor may be both of the enhancement type, i.e. the type of T4, and of the depletion type, i.e. the type of T5. The transistor again comprises p-type source and drain zones 26 and 29, respectively, by way of example interdigitated. The gate electrode 31 is constituted by a rectangle entirely covering the fingers of the source and drain zones and the intermediate channel. On the right-hand side, the source and drain zones are interconnected by a region or zone 40, which can again be implanted simultaneously with the high-ohmic p-type zone 19 and with the source-drain extensions 26a (FIG. 4) or with the channel region 35 (FIG. 5). The region 40 acts as a bleeder and has a resistance of, for example, 100 kΩ, which is higher than the resistance of the transistor T4/T5 in the conductive state (0.5 kΩ), but considerably lower than the resistance of T4/T5 the non-conductive state. Due to this resistance, a leakage path is present at any time so that, if the coil should not be charged with current when T2 and T3 are switched off and hence the voltage at the output terminal should not increase, nevertheless a starting current or charge current will flow to the control electrode of T1. On the other hand, the resistance value of the resistor 40 is so high that the dissipation in the state in which T3 is conducting is nevertheless practically negligible. As a matter of course, the resistor 40 may also take another form that that shown here and may be constituted, for example, by the vapour-deposited polycrystalline silicon layer. Alternatively, the resistor 40 may be constituted by an external resistance element, that is to say that this element is present outside the integrated circuit.

It will be appreciated that the invention is not limited to the embodiments shown here, but that within the scope of the invention many further variations are possible for a person skilled in the art. For example, the dissipation may also be reduced by using instead of a field effect transistor T4 a bipolar pnp transistor, the current then being passed from emitter to collector and the base being coupled to a suitably chosen fixed potential.

Furthermore, if desired, R1 of FIG. 1 may also be included in the channel resistor of the transistor of FIGS. 4 and 5.

What is claimed is:

1. A DC/AC converter bridge circuit comprising, an integrated circuit having connection terminals for the application of a high direct voltage and a low direct voltage, a first insulated gate field effect transistor whose drain is connected to a first connection terminal, a second insulated gate field effect transistor whose source is connected to a second connection terminal, the source of the first field effect transistor and the drain of the second field effect transistor both being connected to an output terminal, a control circuit for supplying an alternating control signal to a gate of the second field effect transistor and in inverted form to a gate of the first field effect transistor whereby the first and second field effect transistors can be made conducting and non-conducting in push-pull, said control circuit comprising an inverter stage having a third insulated gate field effect transistor whose source is connected to the second connection terminal, whose gate is connected to the gate of the second field effect transistor and whose drain is connected to a load element and to the gate of the first field effect transistor, characterized in that the current path of the inverter stage includes, in series with the load element and the third field effect transistor, a switch comprising a fourth transistor of a type complementary to the first, second and third field effect transistors and having a control electrode connected to a point of the circuit such that, during operation, a voltage is applied to the control electrode such that in the state in which the second and third field effect transistors are conducting the fourth field effect transistor is non-conducting or at least substantially non-conducting, and in that in the other state in which the second and third field effect transistors are non-conducting the fourth transistor is conducting.

2. A DC/AC converter as claimed in claim 1, characterized in that the fourth transistor comprises an insulated gate field effect transistor.

3. A DC/AC converter as claimed in claim 1, characterized in that the control circuit further comprises a voltage level shifter having a capacitor with one terminal connected to the output terminal and an other terminal connected via the load element to the gate electrode of the first field effect transistor and further connected to a main electrode of a diode, whose other main electrode is connected to a DC circuit point.

4. A DC/AC converter as claimed in claim 3, characterized in that the source electrode of the fourth field effect transistor is connected to a main electrode of the diode and the drain electrode is connected to the load element.

5. A DC/AC converter as claimed in claim 1, characterized in that the fourth field effect transistor is of the enhancement type having its gate electrode connected to a point to which, during operation, the direct voltage of the second connection terminal is applied.

6. A DC/AC converter as claimed in claim 1, characterized in that the fourth field effect transistor is of the depletion type having its the gate electrode connected to a point to which, during operation, the direct voltage of the first connection terminal is applied.

7. A DC/AC converter as claimed in claim 6, characterized in that the fourth field effect transistor comprises an insulated gate field effect transistor provided in a semiconductor region of a conductivity type opposite to that of the source and drain electrode of said field effect transistor, which is resistively connected to the insulated gate of said field effect transistor.

8. A DC/AC converter as claimed in claim 1, further comprising a resistance element connected in the current path across the switch and whose resistance is high with respect to that of the switch in the conductive state and is low with respect to that of the switch in its nonconductive state.

9. A DC/AC converter as claimed in claim 6, characterized in that the fourth field effect transistor comprises an insulated gate field effect transistor provided in a semiconductor region of a conductivity type opposite to that of the source or drain electrodes of said field effect transistor, which is connected via a rectifying junction to the insulated gate of said field effect transistor.

10. A DC/AC converter as claimed in claim 3, wherein the fourth transistor comprises an insulated gate field effect transistor.

11. A DC/AC converter as claimed in claim 3, characterized in that the fourth field effect transistor is of the enhancement type having its gate electrode connected to a point to which, during operation, the direct voltage of the second connection terminal is applied.

12. A DC/AC converter as claimed in claim 3, characterized in that the fourth field effect transistor is of the depletion type having its gate electrode connected to a point to which, during operation, the direct voltage of the first connection terminal is applied.

13. A DC/AC converter as claimed in claim 1, wherein the fourth transistor comprises an insulated gate field effect transistor having a gate electrode coupled to one of said connection terminals and the control electrode thereof comprises its source electrode.

* * * * *